(12) United States Patent
Kimoto (10) Patent No.: US 7,948,253 B2
(45) Date of Patent: May 24, 2011

(54) PROBE ASSEMBLY

(76) Inventor: Gunsei Kimoto, Tokyo (JP)

( * ) Notice: Subject to any disclaimer, the term of this patent is extended or adjusted under 35 U.S.C. 154(b) by 265 days.

(21) Appl. No.: 12/184,537

(22) Filed: Aug. 1, 2008

(65) Prior Publication Data

US 2009/0033349 A1 Feb. 5, 2009

(30) Foreign Application Priority Data

Aug. 2, 2007 (JP) ................................. 2007-221740

(51) Int. Cl.
*G01R 31/02* (2006.01)
(52) U.S. Cl. .................................................. 324/755.01
(58) Field of Classification Search .................... None
See application file for complete search history.

(56) References Cited

U.S. PATENT DOCUMENTS 7,622,937 B2 * 11/2009 Kimoto .................... 324/756.03

FOREIGN PATENT DOCUMENTS

| JP | 2001-183392 | 7/2001 |
| JP | 2004-340654 | 12/2004 |
| JP | 2006-003191 | 1/2006 |

* cited by examiner

*Primary Examiner* — Jermele M Hollington
(74) *Attorney, Agent, or Firm* — Haynes and Boone, LLP (57) ABSTRACT

An inexpensive probe assembly is provided which is applicable to narrow pad arrangements of LSI circuit designs, while closely-arranged wiring patterns near probe terminals is distributed effectively on an inspection substrate. A probe assembly is provided which is fabricated by etching metallic foil adhering to a resin film to form a conductive pattern including probing function on the resin film, and stacking or parallel-arranging a plurality of the resin films with probing function, the probe assembly used for inspecting circuits on a semiconductor chip by making probe tips collectively contact electrode pads on the chip, characterized in that the probe assembly includes an electrical terminal which is connected to the probe via the conductive pattern and is made to contact with a connecting land of the circuit board at an opposite side in a first direction (vertical direction) on the same plane as the probe.

19 Claims, 8 Drawing Sheets

PROBE ASSEMBLY

CROSS REFERENCE

This application claims priority to Japanese patent application number 2007-221740, filed Aug. 2, 2007, the disclosure of which is incorporated herein by reference.

BACKGROUND OF THE INVENTION

1. Field of the Invention

The present invention relates to a contact element of a prober unit (a probe) for testing circuits of semiconductor chips on a semiconductor wafer in the manufacturing process of electronic devices including LSI. More particularly, the present invention relates to a probe assembly of a prober apparatus for use in a probing test. In the probing test, circuit terminals (pads) arranged on the semiconductor chips on a wafer are made to contact with vertical probes for collective measurement of electrical conductivity of the semiconductor chips.

2. Description of the Related Art

As the semiconductor technology advances, electronic devices have become more highly integrated and a circuit wiring area has increased in each wafer chip. Pads on each wafer chip have also increased in number, and have become more precisely arranged, whereby pad areas become smaller and pad pitches becomes narrower. The pad pitch will become as narrow as 20 μm in the near future.

Chip size packaging (CSP) becomes dominant in which a bear, non-packaged chip is mounted on a circuit board or other substrate. In fabricating the CSP, characteristics and quality of the chips should be verified at the wafer level.

In an exemplary inspection process, a contact element assembly is disposed between test equipment and pads on semiconductor chips. The contact element assembly includes needle probes each having a portion which is elastically deformable due to external force. A printed circuit board called probe card is used for electrically connecting the contact element assembly and test circuits on the semiconductor chips.

The portion of the probe card that interfaces with the test head of the test equipment should have compatibility in shape and pitches with those of the test head. At the same time, the portion of the probe card in contact with the wafer should have compatibility in shape and pitches with those of the chip pad. For this reason, each fabrication of the probe card frequently requires to design the probe card to meet the specifications of the wafer and the test head. Thus, fabrication of a probe card is a time-consuming process.

In addition to a conventional cantilever probe, several types of probes have been developed to meet requirements for testing chips with narrow pad pitches, and for collective testing of plural chips. Proposed probe cards man include: a needle probe card in which probes made of metal fine wires are arranged on a card substrate (Patent Document 1); a blade probe card in which blade-shaped probes are arranged in blocks (Patent Document 2); and a film probe unit (i.e., a probe sheet) in which parallel belt-like wirings are formed on one side of a sheet member such as an electric insulating film, and a part of the wiring is used as a probe element (Patent Document 3).

In conventional cantilever probes for inspecting one or several chips, tip portions of probes for contacting the semiconductor chip pads are narrow-pitched whereas base portion of the probes connected to a probe card are wide-pitched since the probes are arranged to radiate out. In this structure, the probes can be connected, e.g., soldered to circuit terminals of the probe card, which causes few wiring problems.

However, when pursuing a probe structure which meets requirements for testing chips with narrow pad pitches, and for collective testing of plural chips as described above, circuit wiring terminals should be arranged to correspond to the pitch of the probe arrangement, i.e., the pitch of the pads to be inspected. As a result, the probe arrangement should be closely wired.

Figure 7:
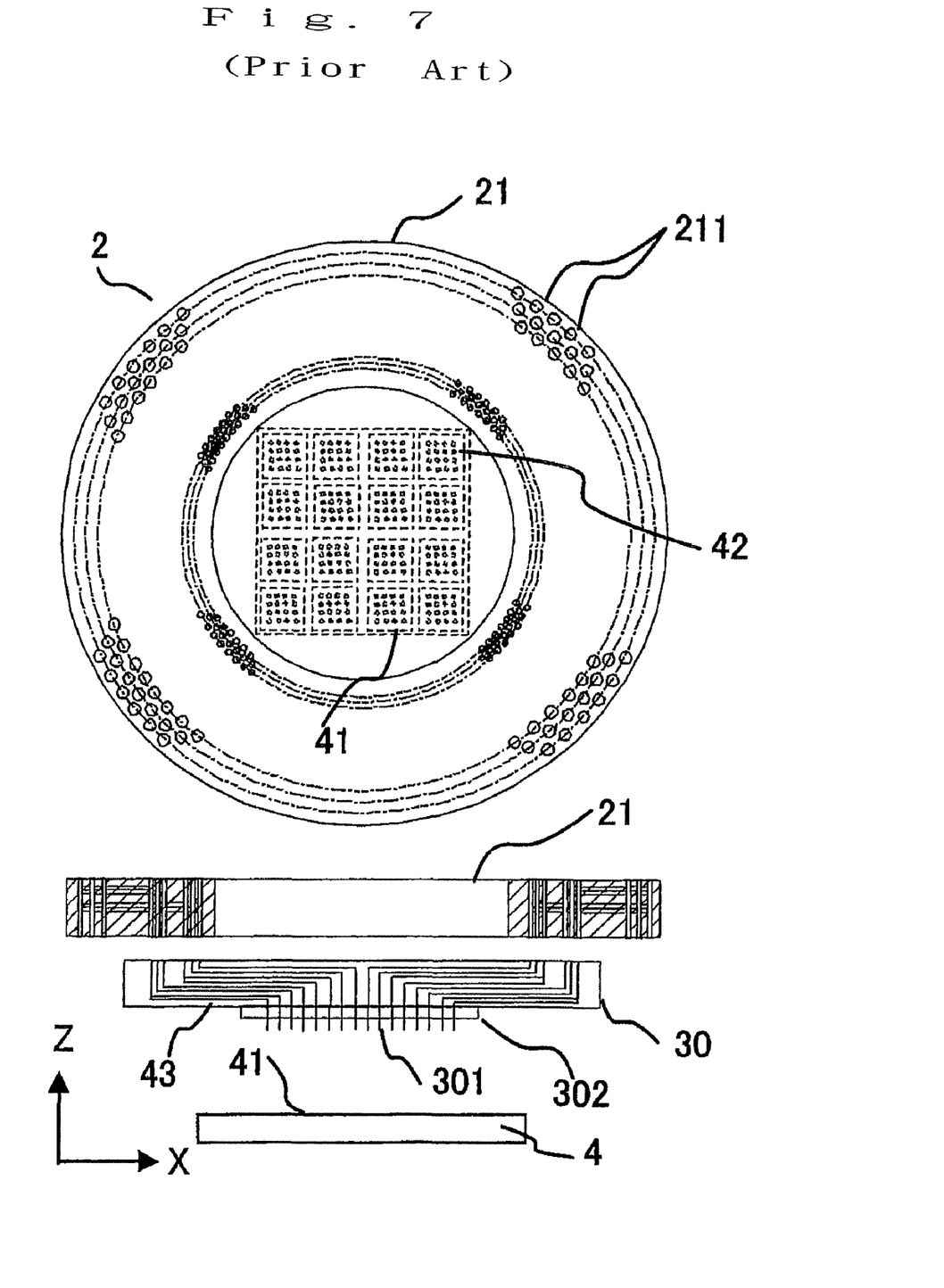
FIG. 7 is a side view schematically illustrating a structure of a conventional probe card.

FIG. 7 shows an example of a conventional probe card focusing on circuit wiring. The probe card includes a probe card 2 and card substrate 21. A chip 41 to be inspected is shown in a perspective view to clarify its positional relationship with the card substrate 21. Terminals 211 arranged at the periphery of the card substrate 21 interface with a test head (not shown) of test equipment. The terminals 211 include sections that have compatibility in shape and pitch with those of the test head.

Probes 301 are attached by a probe alignment fixing device 302 so as to correspond to terminal pads 42 on the chip 41 to be inspected on the wafer 4. The probe alignment fixing device 302 can be selected depending on the probe type. A cantilever probe alignment fixing device 302 may be used for directly soldering the probes 301 to the circuit board. A needle probe alignment fixing device 302 may be a fixing block having, for example, guide grooves formed thereon. A sheet probe alignment fixing device 302 may include a sheet member such as an electric insulating film having parallel belt-like wirings formed on one side thereof, and a part of the wiring is used as a probe element.

As the chips become more highly-integrated and narrow-pitched, wiring patterns at the periphery of the probe become more and more closely arranged. In order to finally distribute the wiring to peripheral terminals of the card substrate 21, the wiring substrate must be a multi-layer substrate having the wiring arranged densely at the periphery of the probe terminals. In a current practical patterning of a printed circuit board, about 128 to 160 wirings per signal layer is appropriate. For example, a circuit tester with about 1000 pins requires over 20 layers including a power supply layer, having thickness of 4.8 to 6.5 mm, and diameter of about 350 mm.

In terms of economical efficiency of a probe card and a standardized card substrate 21, a conversion wiring board 30 may be disposed between the probe card and the wafer so as to function as a complicated conversion wiring 43 which varies depending on the pad to be inspected (See Patent Document 3).

Figure 8:
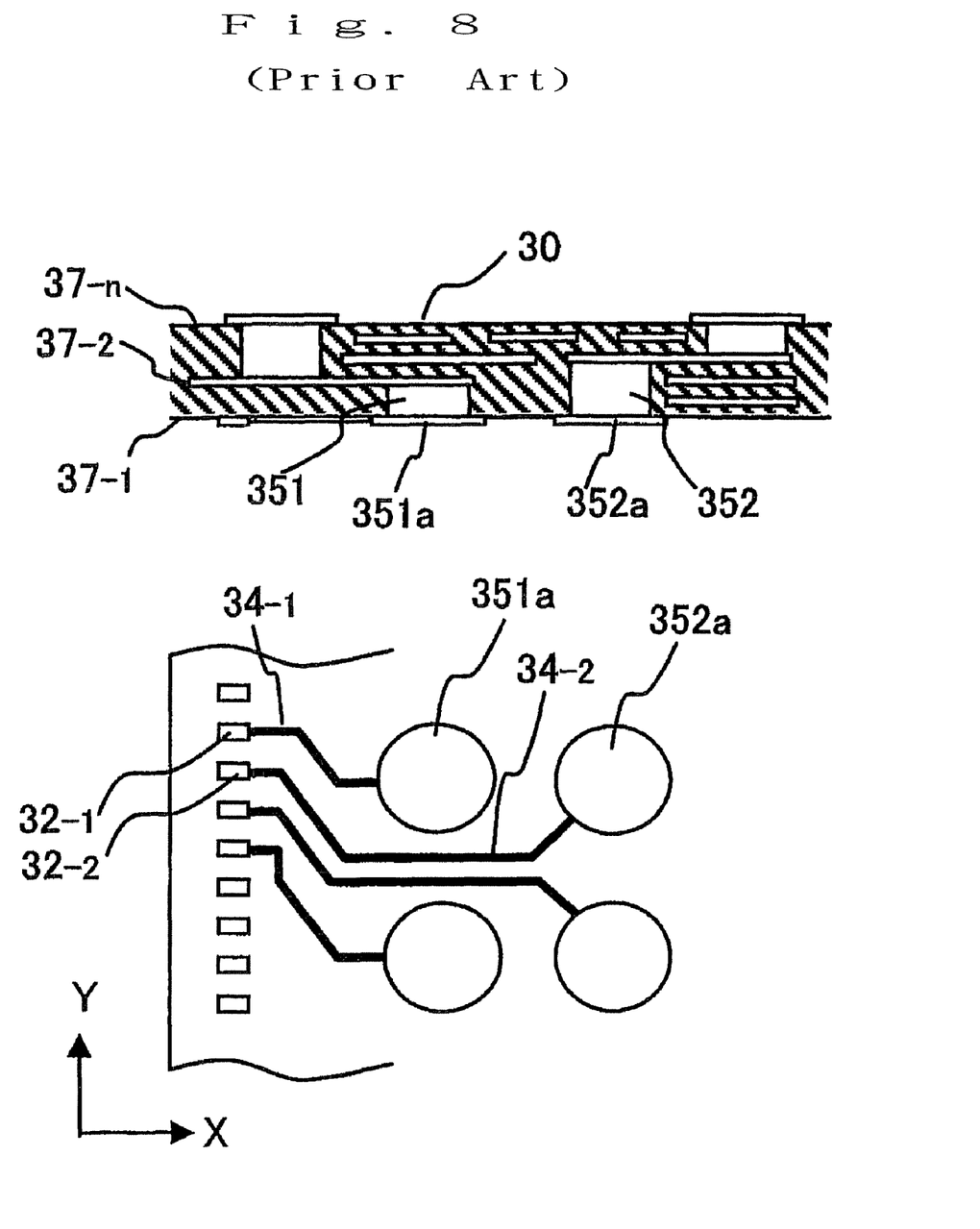
FIG. 8 is a plan view of a peripheral structure of a conventional probe terminal.

An exemplary wiring pattern near the probe terminals is shown in FIG. 8. In FIG. 8, a probe terminal 32-1 (e.g., a terminal on the probe sheet) on the conversion wiring board 30 is arranged at a μm pitch to correspond to the pad on the chip to be inspected. In order to distribute the wiring from the probe terminals in a wide-pitched pattern, the wiring is connected to a land 351*a* of a via hole 351 for interlayer conduction via a pattern 34-1 on a first layer 37-1 of the conversion wiring board 30. The wiring is extended from the land 351*a* via the via hole 351, and via conductive patterns and via holes on a second layer 37-2 and above layers of the conversion wiring board 30 to a backside layer (i.e., the layer of inspection equipment side), which is a nth layer 37-*n* on the conversion wiring board 30.

Similarly, wiring is extended from a probe terminal 32-2 to a land 352*a* of a via hole 352 via a pattern 34-2 on the first layer 37-1 of the conversion wiring board 30. The pattern is developed from the land 352*a* via the via hole 352, and via conductors and via holes on the second layer 37-2 and above layers on the conversion wiring board 30 to the backside layer, which is the nth layer 37-n on the conversion wiring board 30.

As described above, in order to convert the pattern wiring from the probe terminal corresponding to the chip to be inspected 41 to the wide-pitched pattern wiring using a multilayer substrate, lands of the via holes connected to each probe terminal need to be positioned near the probe terminal on the same layer.

[Patent Document 1] Japanese Patent Application Laid-Open (JP-A) No. 2006-003191
[Patent Document 2] JP-A No. 2004-340654
[Patent Document 3] JP-A No. 2001-183392

A presently common pitch of via holes and lands is, however, about 0.5 mm, which is large about 10 times as compared with a pad pitch of a chip to be inspected. When considering a pattern wiring area from a probe terminal, the land arrangement cannot be within a probe region.

If the land arrangement also include outside area of the probe region, then a multi-pinned structure is difficult to establish and collective testing of plural chips is prevented. Further, the lengths of the wirings from each of the probe terminals vary considerably to prevent impedance matching.

In view of the aforementioned, an object of the invention is to provide an inexpensive probe card which is applicable to narrow-pitched pad arrangements while addressing the problem of closely-arranged wirings near probe terminals.

SUMMARY OF THE INVENTION

The invention is, in a probe assembly which is fabricated by etching metallic foil adhering to a resin film to form a conductive pattern including probing function on the resin film, and stacking or parallel-arranging a plurality of the resin films with probing function, the probe assembly used for inspecting circuits on a semiconductor chip by making probe tips collectively contact electrode pads on the chip, characterized in that the probe assembly includes an electrical terminal which is connected to the probe via the conductive pattern and is made to contact with a connecting land of the circuit board at an opposite side in a first direction (Z direction of an XYZ orthogonal coordinate system) on the same plane as the probe.

With this configuration, since the invention is characterized in that the probe assembly includes an electrical terminal which is connected to the probe via the conductive pattern and is made to contact with a connecting land of the circuit board at an opposite side in a first direction (Z direction) on the same plane as the probe, because output terminals of the probes protrude from different positions of the probe sheet, output positions of the electrical terminals on the conversion wiring board for input/output to/from the probe can be changed in the probe sheet in advance, the output positions can be determined independently of probe tip arrangement and wiring pattern from the probe terminals that conventional embodiments were dependent on.

The invention is also characterized in that the length of the electrical terminal in the first direction (Z direction) is substantially the same as the thickness of the circuit board, and the width in a second direction (X direction) is slightly longer than an inner diameter of a through hole provided on the circuit board. Thus, the electrical terminal can be press-fit into the through hole on the circuit board.

With this configuration, since the length of the electrical terminal in the first direction (Z direction) is substantially the same as the thickness of the circuit board, and the width in a second direction (X direction) is slightly longer than an inner diameter of a through hole provided on the circuit board, an advantageous effect is produced in that a typical interlayer connecting means of press-fitting into a through hole can be employed.

The invention is also characterized in that each of the electrical terminals is formed on the resin film independently at a position in the second direction (X direction) such that when the resin films with probing function are stacked or parallel-arranged, the electrical terminals correspond to some or all of the connecting lands on the circuit board.

With this configuration, since that each of the electrical terminals is formed on the resin film independently at a position in the second direction (X direction) such that when the resin films with probing function are stacked or parallel-arranged, the electrical terminals correspond to some or all of the connecting lands on the circuit board, because output positions of the electrical terminals have already been changed in the probe sheet, the output positions can be determined independently of wiring pattern from the probe terminals.

The invention is also characterized in that a pitch of the electrical terminals in a third direction (Y direction of an XYZ orthogonal coordinate system) when the resin films with probing function are stacked is the integral multiple of the thickness of the resin film with probe function. Thus, the pitch in the Y direction is determined by the stacked resin films with probe function.

With this configuration, since the pitch of the electrical terminals in a third direction (Y direction) when the resin films with probing function are stacked is the integral multiple of the thickness of the resin film with probe function, the pitch in the Y direction is precisely determined by the stacked resin films with probe function.

The invention is also characterized in that a pitch of the electrical terminals in the third direction (Y direction) when the resin films with probing function are stacked or parallel-arranged corresponds to some or all of the connecting lands on the circuit board.

With this configuration, since the pitch of the electrical terminals in the third direction (Y direction) when the resin films with probing function are stacked or parallel-arranged corresponds to some or all of the connecting lands on the circuit board, an advantageous effect is produced in that the probe assembly is applicable to any pitches in the Y direction.

DETAILED DESCRIPTION OF THE PREFERRED EMBODIMENTS

The embodiments of the invention will be described with reference to the accompanying drawings. The invention, however, is not limited to these embodiments.

First Embodiment

Figure 1:
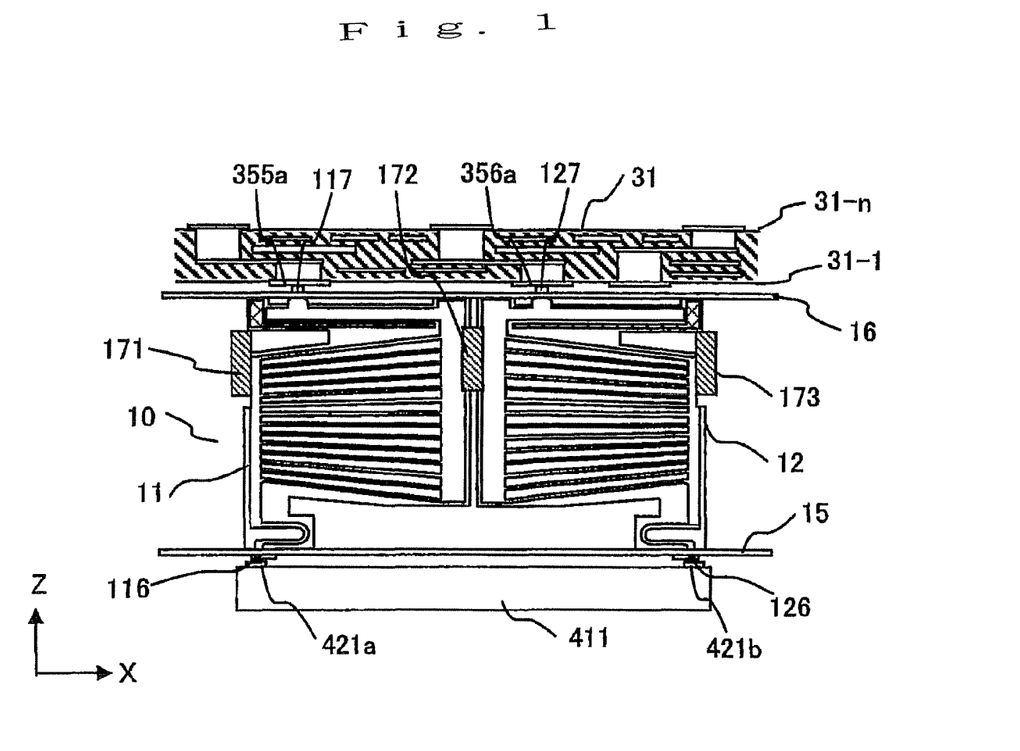
FIG. 1 is a side view of a probe assembly structure according to a first embodiment of the invention.

FIG. 1 illustrates a probe structure according to the first embodiment in the cross section. The illustrated structure includes a probe unit 10, a chip to be inspected 411, pads 421a and 421b facing each other on a single chip to be inspected 411 (peripherally-arranged pads are shown in FIG. 1), a conversion wiring board 31, and electrical terminals 355a and 356a formed on the conversion wiring board 31 for input/output to/from the probe.

The probe unit 10 includes resin films 11 and 12 with probing function. A probe and a conductor for measuring the pad 421a are etched on the resin film 11 with probing function. A probe and a conductor for measuring the pad 421b are etched on the resin film 12 with probing function. Support rods 171 to 173 for supporting the resin films with probing function are shown in cross section.

Figure 2A:
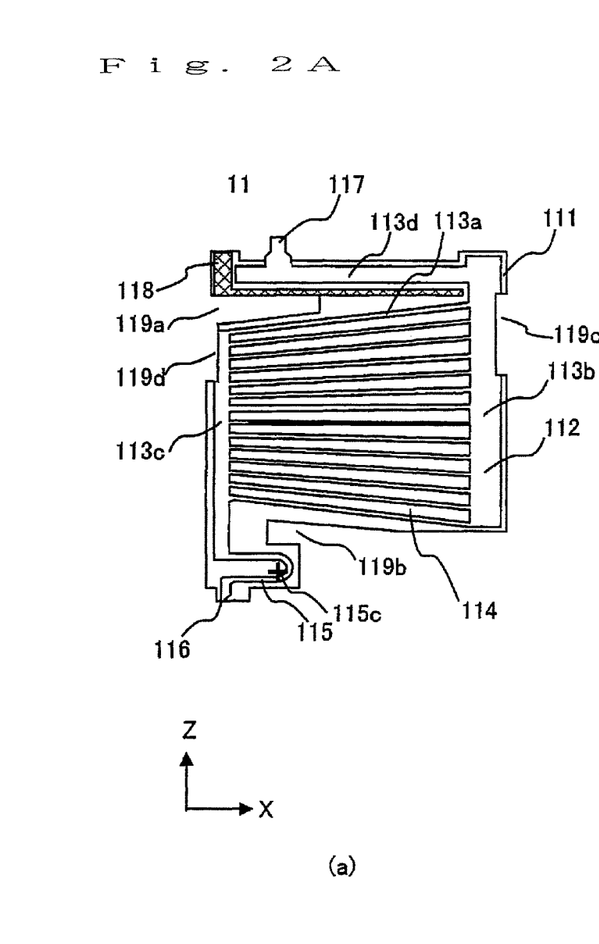
FIG. 2 is a side view of a probe structure according to the first embodiment of the invention.

Referring to FIG. 2, a method of forming and a structure of the resin film 11 with probing function will be described in detail. As shown in FIG. 2A, metallic foil is attached to a resin film (e.g., polyimide resin) 111. Copper foil, such as beryllium copper foil is used herein. The copper foil is then etched to provide a conductive pattern 112. In this embodiment, the conductive pattern 112 includes parallel beams 113a and slits 114, which altogether constitute plural (thirteen in this embodiment) link mechanisms. Cut-outs 119a and 119b are also provided in the copper foil to help parallel springs to perform the probing operation.

Parallel springs herein indicate a plurality of substantially identically shaped beams disposed in parallel with one another. Both ends of the beams are fixed on shared non-deforming supports. One of the supports is moved to cause the beams to move in parallel with one another within a certain range while the other of the supports is fixed. In the present embodiment, a section 113 serves as a fixed part and a section 113c serves as a vertical probe. With this structure, overdrive is given in a Z direction of an XYZ orthogonal coordinate system.

A rotating deforming part 115 is connected to a tip of the vertical probe 113c. When the pad begins contact with the probe tip 116 of the rotating deforming part, overdrive is given in a direction in which the probe tip 310 is pushed upward in a certain amount. When the overdrive is continued to be given, the rotating deforming part 115 begins rotating clockwise about a rotational center 115c to begin scrubbing action.

An output terminal 117 is provided to protrude from the resin film 111 on an extended line of the fixed portion 113b. The output terminal 117 is pressed against the electrical terminal 356a on the conversion wiring board 31 due to the spring force from a structure of the arm 312 and the cut-out 305.

Figure 2B:
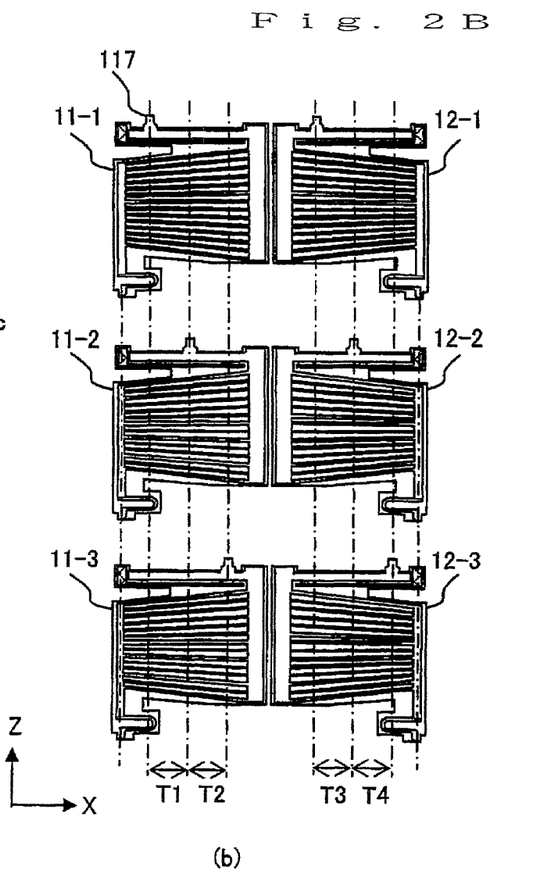

As shown in FIG. 2B, each of the output terminals 117 may be positioned in a shifted manner by an amount of T1, T2, T3 or T4 in accordance with the position of the corresponding electrical terminals on the conversion wiring board. Probes of any configuration can be collectively fabricated on a single resin film at low cost by etching and cutting into pieces.

A reinforcement section 118 may be suitably provided by printing a sheet of insulating resin on the resin film 11. Thus, rigidity required for the film probe can be ensured.

Cut-outs 119c and 119d are provided conforming to the sectional shape of the support rod 171 shown in FIG. 3 and described later.

The resin film 12 with probing function may be fabricated in the same manner as in the resin film 11 with probing function. A probe tip 126, an output terminal 127 and the direction on which the parallel spring acts can differ from those in the resin film 11. Probes of different configurations may be etched on a single resin film and then cut into pieces. In this manner, probes of different configuration can be provided at low cost.

The resin films with probing function shown in FIG. 2 are stacked to form a probe unit 10 and a probe assembly 1 as shown in FIG. 3. A method of forming and a structure of the probe unit 10 and the probe assembly 1 are shown in detail in FIG. 3.

In FIG. 3, a probe unit 10-1 is an assembly of probes corresponding to the chip 411 to be inspected. A probe unit 10-2 (not shown) having the same structure as that of the probe unit 10-1 is an assembly of probes corresponding to the chip 412 to be inspected. Similarly, probe units 10-3 to 10-n are combined together to constitute the probe assembly 1 for n chips to be inspected.

The probes are inserted and aligned along the support rods 171 to 173 so as to be precisely positioned along the Z direction. The support rods 171 to 173 are support points for the pressing force of the probe tip 116 and the output terminal 117.

Figure 3A:
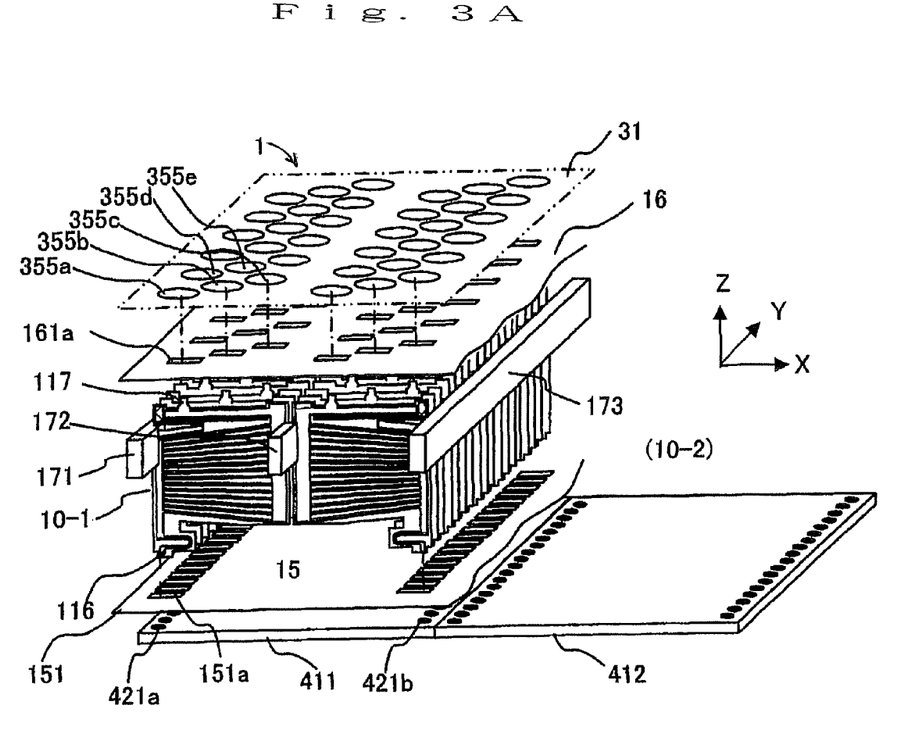
FIG. 3 is a perspective view of the probe assembly structure according to the first embodiment of the invention.
Figure 3B:
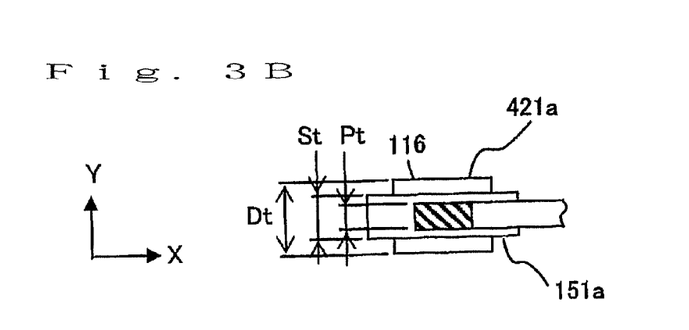

Alignment and fixation of each probe unit in the X and Y directions of the XYZ orthogonal coordinate system can be achieved by fixing sheets 15 and 16 shown in FIG. 3A. The fixing sheet 15 includes a resin film 151 in which slits 151a are formed to correspond to the pads such as pads 421a and 421b. As shown in FIG. 3B, the length of the slit 151a is slightly longer than the thickness Pt of the resin film with probing function, and the width St is narrower than the pad width Dt. Portions of the resin film with probing function near the probe tip are made to pass through the slits so that the resin film can be aligned with the pads.

The fixing sheet 16 includes a resin film 161 in which slits are formed to correspond to the electrical terminals 355a and 356a on the conversion wiring board for input/output to/from the probe. The width of the slit is slightly larger than the thickness of the probe sheet. Portions of the resin film with probing function near the output terminals are made to pass through the slits so that the resin film can be aligned with the electrical terminals for input/output to/from the probes.

Figure 4:
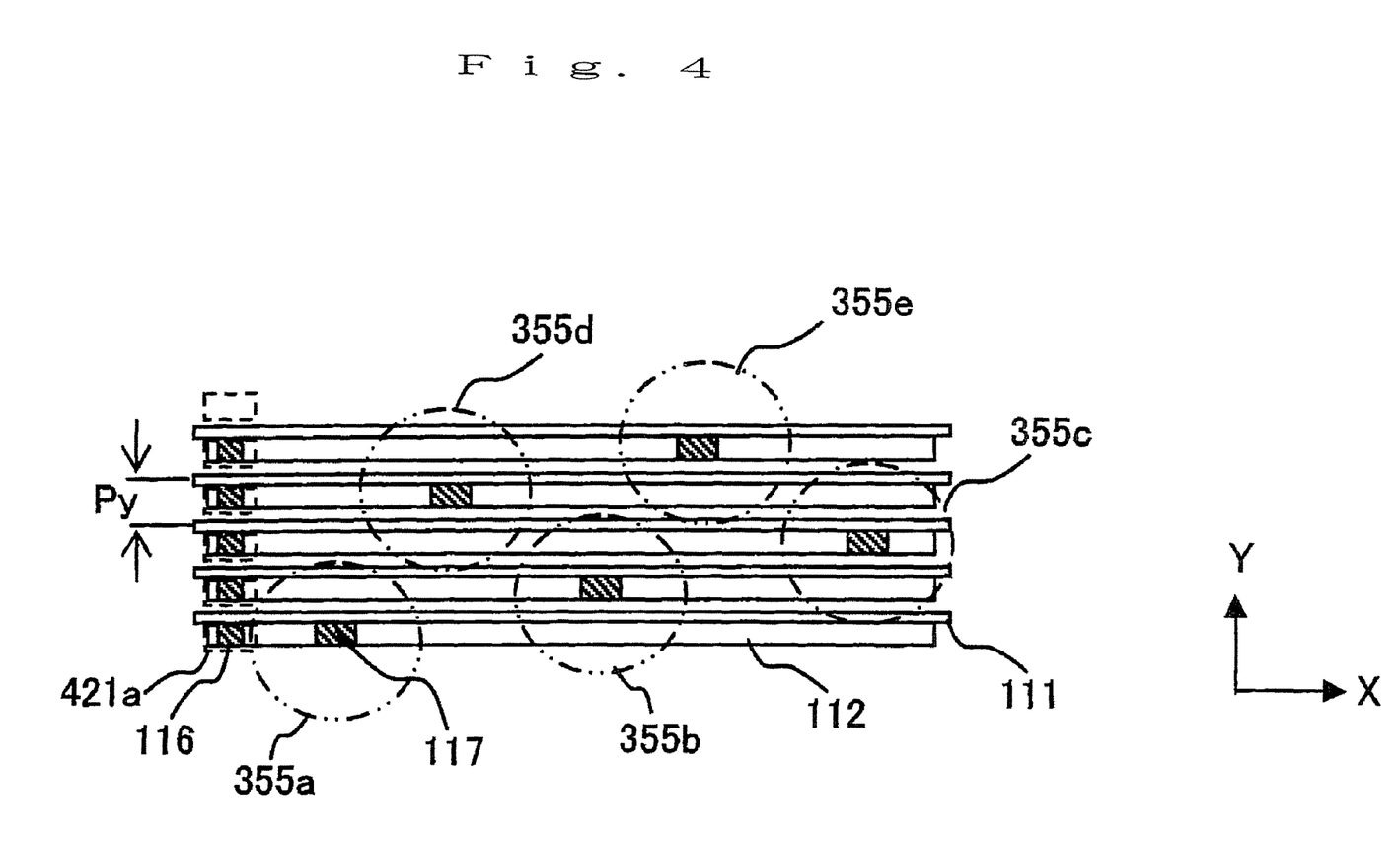
FIG. 4 is a plan view illustrating a positional relationship between the probe structure and pads according to the first embodiment of the invention.

Next, the operation of the embodiment will be described with reference to FIG. 4. FIG. 4 is a partially perspective view of a probe unit 10 viewed from above (from the side of the inspection substrate), showing a relative relationship between the arranged chip pads (which correspond to the probe tips) and land arrangement on the conversion wiring board for input/output to/from the probes (which correspond to the arrangement of the output terminals of the resin film with probing function).

As shown in FIG. 4, the output positions of the lands on the conversion wiring board for input/output to/from the probes have already been changed in the resin film with probing function. Therefore, the output positions can be determined independently of the probe arrangement and the wiring pattern (e.g., 34-1 shown in FIG. 8) that conventional embodiments were dependent on.

Accordingly, a pitch Py in the Y direction of the electrical terminals for input/output to/from the probes can be determined by the fixing sheet 15, or alternatively can be determined to the Y direction thickness of the resin film with probing function by directly stacking the resin films with probing function.

Since the pitch Px in the X direction can be the minimum distance between the lands from a design viewpoint. In this manner, the entire area of the chip to be inspected can be allocated for required land arrangement.

In the example shown in FIG. 4, the electrical terminals on the conversion wiring board are land on via holes. However, as shown in FIG. 6, the electrical terminals may also be relay lands on the pattern wiring that can be selected according to the design pattern of the conversion wiring board.

Second Embodiment

Figure 5:
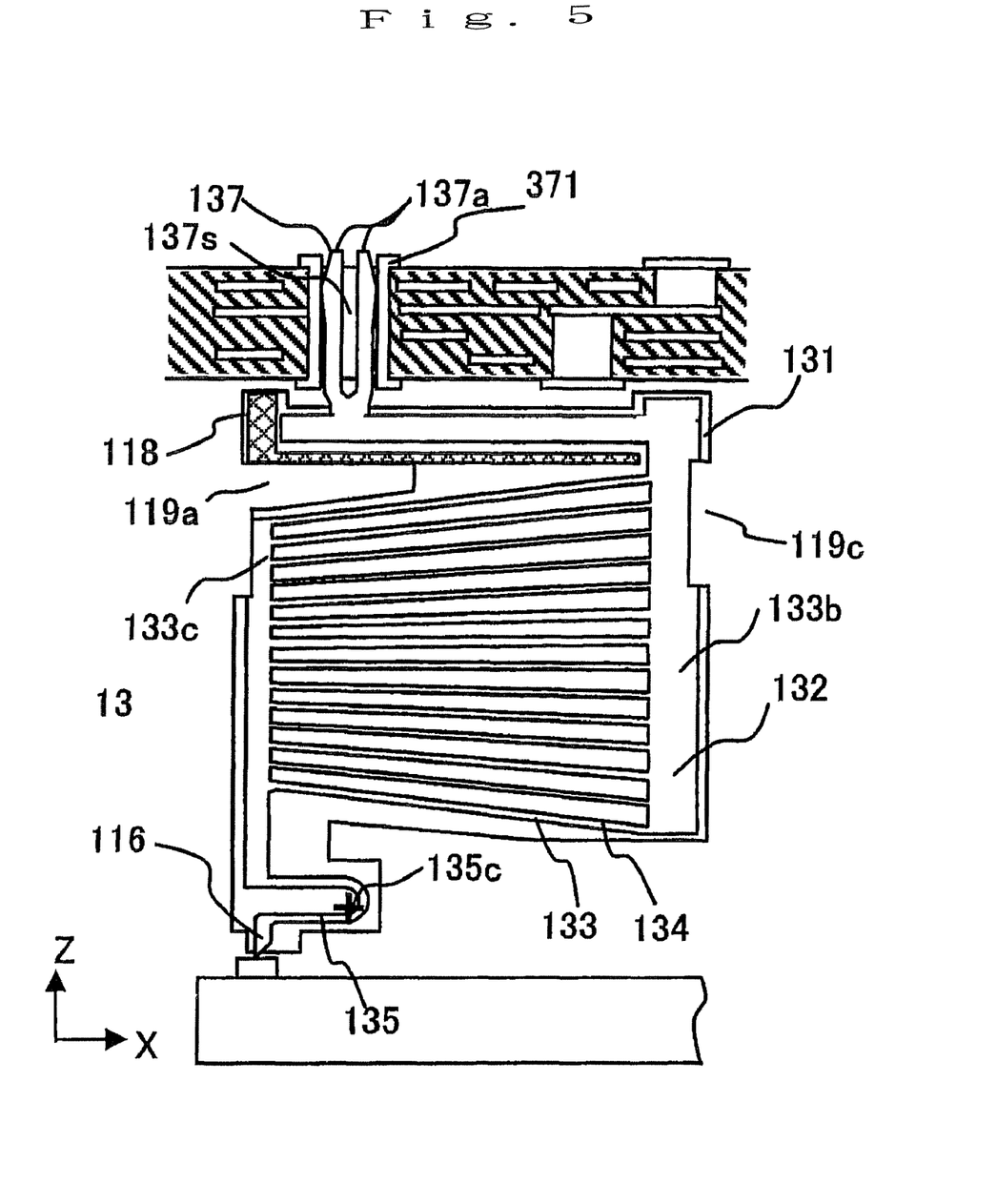
FIG. 5 is a side view of a probe structure according to a second embodiment of the invention.

A probe structure according to a second embodiment of the invention is shown in FIG. 5. This probe structure differs from that shown in FIG. 2 in the shape of output terminals of a resin film with probing function.

Figure 6:
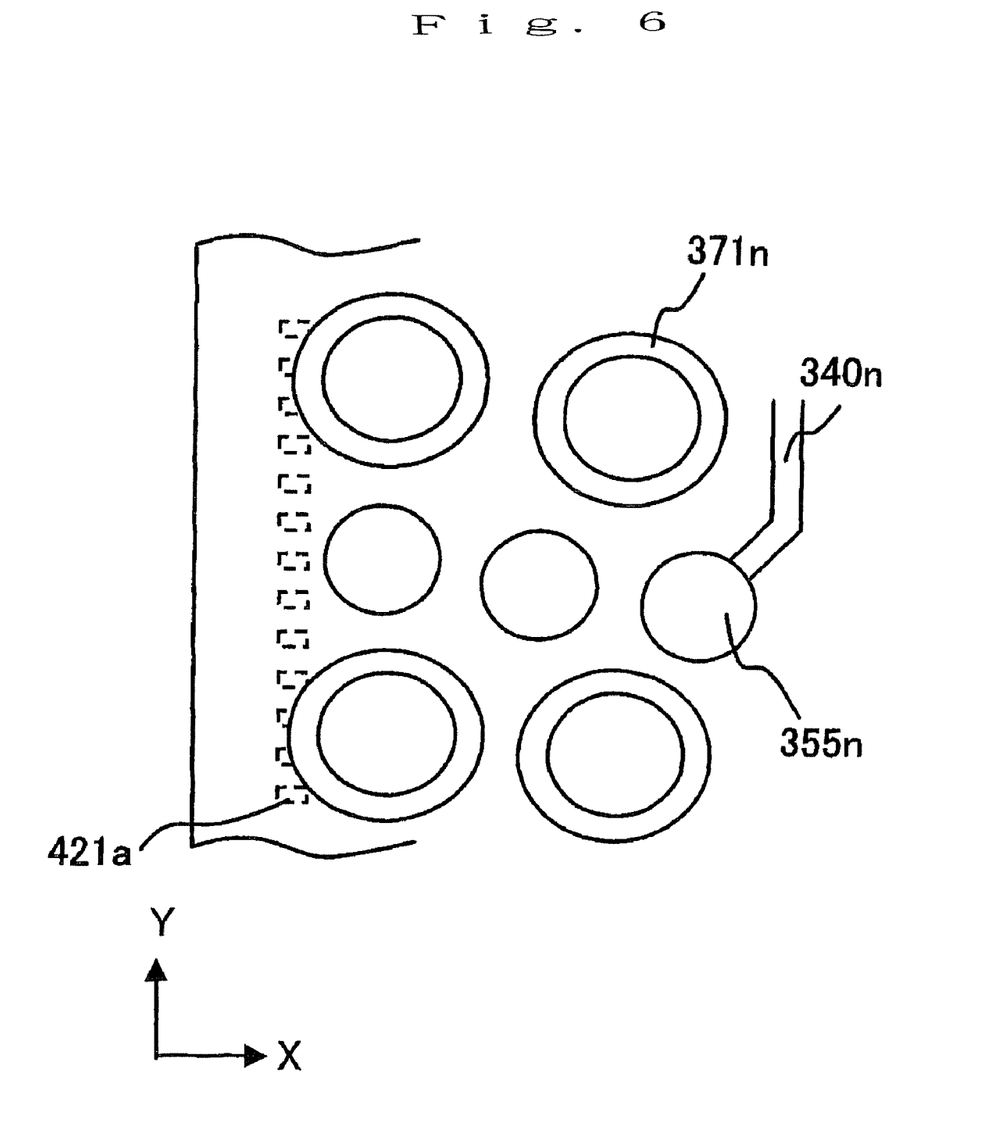
FIG. 6 is a plan view illustrating a positional relationship between the probe structure and pads according to the second embodiment of the invention.

Referring to FIG. 6, a method of forming and a structure of the resin film 13 with probing function will be described in detail. As shown in FIG. 6, metallic foil is attached to a resin film (e.g., polyimide resin) 131. Copper foil, such as beryllium copper foil is used herein. The copper foil is then etched to provide a conductive pattern 132. In this embodiment, the conductive pattern 132 includes parallel beams 133 and slits 134, which altogether constitute plural (thirteen in this embodiment) link mechanisms. A cut-out 139a is also provided in the copper foil to help parallel springs to perform the probing operation.

A rotating deforming part 135 is connected to a tip of the vertical probe 133c. When the overdrive is continued to be given, the rotating deforming part 135 begins rotating clockwise about a rotational center 135c to begin scrubbing action.

A reinforcement section 118 may be suitably provided by printing a sheet of insulating resin on the resin film 13. Thus, rigidity required for the film probe can be ensured.

Output terminals 137 are provided to protrude from the resin film 131 on an extended line of the fixed portion 133b. The output terminals 137 can be inserted in a through hole 371 in the conversion wiring board. The length of the output terminal 137 in the Z direction is almost the same as the thickness of the conversion wiring board. The width of the output terminal 137 in the X direction is slightly larger than the inner diameter of the through hole 371. A slit 137s is provided at the center of the output terminal, with which the terminals 137a are able to be press-fit in the through hole due to the spring force acting in the X direction.

With the thus-shaped output terminals, the embodiment can be applied to a conversion wiring board that has a through hole as shown in FIG. 6.

The resin film 13 with probing function can be fabricated in the same manner as those of the resin films 11 and 12. Probes of any configuration can be collectively fabricated on a single resin film at low cost by etching and cutting into pieces.

As described above, in a probe assembly fabricated by etching metallic foil such as copper foil adhering to a resin film to form a conductive pattern including a probe on the resin film, and stacking a plurality of such resin films with probing function, the probe assembly used for inspecting circuits on a semiconductor chip by making probe tips collectively contact electrode pads on the chip, since output terminals of the probes protrude from different positions of the resin films, output positions of electrical terminals on a conversion wiring board for input/output to/from the probe have already been changed in the resin film with probing function, the output positions can be determined independently of probe tip arrangement and wiring pattern that conventional embodiments were dependent on.

According to the probe assembly of the invention, an inexpensive probe assembly can be provided which is applicable to various pad arrangements and variation in pad pitches of LSI circuit designs, while closely-arranged wiring patterns near probe tips can be distributed effectively on an inspection substrate.

Although preferred embodiments illustrated in the drawings have been described above, it is apparent to those skilled in the art that various changes and modifications can be easily made to the invention without departing the scope of the invention. It is contemplated that the invention includes such changes and modifications.

What is claimed is:

1. A probe assembly for inspecting circuits on a semiconductor chip comprising:
   a probe, comprising:
      a plurality of stacked or parallel-arranged resin films;
      a plurality of metallic foils, each metallic foil being attached to a respective one of the resin films;
      a plurality of conductive patterns, each conductive pattern being etched in a respective one of the metallic foils, each conductive pattern having a probing function; and
      a plurality of probe tips adapted to collectively contact electrode pads on the chip, each probe tip being located at an end of a respective one of the conductive patterns on a first side of the probe; and
   a plurality of electrical terminals, each electrical terminal being connected to the probe via at least one of the conductive patterns and disposed, relative to the probe, so that the electrical terminal is adapted to contact a connecting land of a circuit board at a second side of the probe, the second side being opposite to the first side in a first direction (Z direction) on the same plane as the probe.

2. A probe assembly according to claim 1, wherein the length of the electrical terminal in the fist direction (Z direction) is substantially the same as the thickness of the circuit board, and the width in a second direction (X direction) is slightly longer than an inner diameter of a through hole provided on the circuit board.

3. A probe assembly according to claim 1, wherein each of the electrical terminals is formed on one of the resin films independently at a position in a second direction (X direction) such that when the resin films with probing function are stacked or parallel-arranged, the electrical terminals correspond to some or all of the connecting lands on the circuit board.

4. A probe assembly according to claim 1, wherein a pitch of the electrical terminals in a third direction (Y direction) when the resin films with probing function are stacked is the integral multiple of the thickness of the resin film with probe function.

5. A probe assembly according to claim 1, wherein a pitch of the electrical terminals in a third direction (Y direction) when the resin films with probing function are stacked or parallel-arranged corresponds to some or all of the connecting lands on the circuit board.

6. A method for forming a probe assembly used for inspecting circuits on a semiconductor chip by making probe tips collectively contact electrode pads on the chip, comprising:
   providing a probe, comprising:

etching metallic foil adhering to a resin film to form a conductive pattern including probing function on the resin film, and stacking or parallel-arranging a plurality of the resin films with probing function; and connecting a plurality of electrical terminals to the probe via the conductive pattern;

wherein at least two electrical terminals in the plurality of electrical terminals are each selected from the group consisting of:

an electrical terminal in contact with a connecting land of a circuit board at an opposite side in a first direction (Z direction) on the same plane as the probe;

an electrical terminal wherein the length of the electrical terminal in the first direction (Z direction) is substantially the same as the thickness of the circuit board, and the width in a second direction (X direction) is slightly longer than an inner diameter of a through hole provided on the circuit board;

an electrical terminal formed on the resin film independently at a position in the second direction (X direction) such that when the resin films with probing function are stacked or parallel-arranged, the electrical terminals correspond to some or all of the connecting lands on the circuit board; and an electrical terminal wherein a pitch of the electrical terminal in the third direction (Y direction) when the resin films with probing function are stacked or parallel-arranged corresponds to some or all of the connecting lands on the circuit board; and wherein the resin film with probing function which includes one of the at least two electrical terminals is formed from the same resin film as the resin film with probing function that includes the other of the at least two electrical terminals.

7. A probe assembly according to claim 1, further comprising a fixing sheet for probe arrangement, the fixing sheet including a slit sized slightly larger than a section of the probe near a contacting portion with the pad, and is equal to or slightly smaller than the width of the pad in the direction of adjacent pads (Y direction).

8. A probe assembly according to claim 7, wherein plurality of slits are formed on the fixing sheet for probe arrangement to correspond to some or all of the pads of the semiconductor chip to be inspected.

9. A probe assembly according to claim 7, wherein the fixing sheet for probe arrangement is formed from a resin film.

10. A probe assembly according to claim 7, wherein each probe tip of the probe assembly is in advance made to pass through the slit on the fixing sheet for probe arrangement.

11. A probe assembly according to claim 1, further comprising a fixing sheet for electrical terminal arrangement, the fixing sheet including a slit sized slightly larger than a section of the electrical terminal near a contacting portion with the circuit board, and is equal to or slightly smaller than the width of an adjacent land.

12. A probe assembly according to claim 11, wherein a plurality of slits is formed on the fixing sheet for electrical terminal arrangement at positions corresponding to some or all of the lands of the circuit board.

13. A probe assembly according to claim 11, wherein the fixing sheet for electrical terminal arrangement is formed from a resin film.

14. A probe assembly according to claim 11, wherein each of the electrical terminals of the probe assembly is in advance made to pass through the slit on the fixing sheet for electrical terminal arrangement.

15. A probe assembly according to claim 2, wherein each of the electrical terminals is formed on the resin film independently at a position in the second direction (X direction) such that when the resin films with probing function are stacked or parallel-arranged, the electrical terminals correspond to some or all of the connecting lands on the circuit board.

16. A probe assembly according to claim 2, wherein a pitch of the electrical terminals in a third direction (Y direction) when the resin films with probing function are stacked is the integral multiple of the thickness of the resin film with probe function.

17. A probe assembly according to claim 2, wherein a pitch of the electrical terminals in the third direction (Y direction) when the resin films with probing function are stacked or parallel-arranged corresponds to some or all of the connecting lands on the circuit board.

18. A probe assembly according to claim 2, further comprising a fixing sheet for probe arrangement, the fixing sheet including a slit sized slightly larger than a section of the probe near a contacting portion with the pad, and is equal to or slightly smaller than the width of the pad in the direction of adjacent pads (Y direction).

19. A probe assembly according to claim 2, further comprising a fixing sheet for electrical terminal arrangement, the fixing sheet including a slit sized slightly larger than a section of the electrical terminal near a contacting portion with the circuit board, and is equal to or slightly smaller than the width of an adjacent land.

* * * * *